United States Patent
Weidner

(10) Patent No.: US 6,190,827 B1
(45) Date of Patent: Feb. 20, 2001

(54) LASER DONOR ELEMENT

(75) Inventor: Charles H. Weidner, Ontario, NY (US)

(73) Assignee: Eastman Kodak Company, Rochester, NY (US)

(*) Notice: Under 35 U.S.C. 154(b), the term of this patent shall be extended for 0 days.

(21) Appl. No.: 09/564,887

(22) Filed: May 4, 2000

(51) Int. Cl.⁷ ............................. G03F 7/34; G03F 7/039; G03C 1/72
(52) U.S. Cl. ...................... 430/201; 430/200; 430/273.1; 430/933; 430/964
(58) Field of Search ................................. 430/200, 201, 430/933, 964, 273.1

(56) References Cited

U.S. PATENT DOCUMENTS

| | | | |
|---|---|---|---|
| 5,126,760 | 6/1992 | DeBoer | 430/201 |
| 5,171,650 | 12/1992 | Ellis et al. | 430/201 |
| 5,278,023 | 1/1994 | Bills et al. | 430/201 |
| 5,464,723 | * 11/1995 | Chou | 430/201 |

* cited by examiner

*Primary Examiner*—Richard L. Schilling
(74) *Attorney, Agent, or Firm*—Harold E. Cole

(57) ABSTRACT

A laser donor element comprising a transparent support having thereon the following layers in the order recited:

a) a hydrophilic layer;

b) a propellant layer comprising a gas-producing polymer being capable of forming a gas upon heating by the laser and an infrared-absorbing material, the propellant layer having been coated using a polar solvent having an $E_t$ value of between about 0.3 and 1.0; and c) a colorant transfer layer comprising a white pigment and an optical brightener dispersed in a binder.

18 Claims, No Drawings

LASER DONOR ELEMENT

CROSS REFERENCE TO RELATED APPLICATION

Reference is made to commonly assigned, co-pending U.S. patent application Ser. No. 09/475,579 pending by Weidner et al., filed Dec. 30, 1999 entitled "Laser Donor Element", the disclosure of which is hereby incorporated by reference.

FIELD OF THE INVENTION

This invention relates to use of a laser donor element and process for producing a laser-induced white transfer image.

BACKGROUND OF THE INVENTION

There is great interest in the generation of images using thermal transfer technology, particularly in the generation of images via near-infrared laser devices. In general, most of these systems rely on the conversion of light to heat energy by an IR absorber, and the subsequent transfer of colorant or other imaging material from the exposed areas to a receiver. The images derived may be monochrome, or by repetition of the process with various colored donors, a multi-colored image can be produced on a common receiver, useful for generating color proofs. The process can also be used to transfer other materials to a receiver, such as IR absorbing materials, UV absorbing materials, polymeric binders or other useful imaging materials. This process is described, for example, in U.S. Pat. No. 5,126,760 which discloses the use of an IR absorber to effect sublimation or diffusion of a colorant from a donor element to a receiver layer.

U.S. Pat. No. 5,278,023 discloses a propellant-containing thermal transfer donor element which is used to mass transfer colorants to a receiver element. However, there is a problem with this element in that during laser imaging, a portion of the infrared-absorbing material transfers to the receiving element and causes color contamination.

U.S. Pat. No. 5,171,650 a discloses a laser thermal donor element which uses ablation transfer mechanism to transfer a colorant to a receiver element. However, again there is a problem with this element in that during laser imaging, a portion of the infrared-absorbing material transfers to the receiving element and causes color contamination.

It is an object of this invention is to provide a laser donor element that is capable of transferring images without color contamination by other components contained within the donor element.

It is another object of this invention is to provide a rapid and efficient process for the transfer of a white pigment to a receiver which has improved whiteness.

SUMMARY OF THE INVENTION

These and other objects are obtained by this invention which relates to a laser donor element comprising a transparent support having thereon the following layers in the order recited:

a) a hydrophilic layer;
b) a propellant layer comprising a gas-producing polymer being capable of forming a gas upon heating by the laser and an infrared-absorbing material, the propellant layer having been coated using a polar solvent having an $E_t$ value of between about 0.3 and 1.0; and
c) a colorant transfer layer comprising a white pigment and an optical brightener dispersed in a binder.

Another embodiment of the invention relates to a process of producing a laser-induced transfer image comprising:

I) imagewise-heating, by means of a laser, the laser donor element described above, and
II) transferring the laser-induced image to a receiving element.

By use of the invention, color contamination caused by unwanted transfer of infrared-absorbing material is minimized and improved whiteness is obtained.

DETAILED DESCRIPTION OF THE INVENTION

Any transparent material can be used as the support for the colorant-donor element employed in the invention provided it is dimensionally stable and can withstand the heat of the laser. Such materials include polyesters such as poly(ethylene terephthalate) or poly(ethylene naphthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyetherimides. The support generally has a thickness of from about 5 to about 200 μm. It may also be coated with a subbing layer, if desired, such as those materials described in U.S. Pat. Nos. 4,695,288 or 4,737,486. It may also be coated with any of the anti-static and/or slip layers well known to those in the imaging art.

The hydrophilic layer used in the invention may be, for example, gelatin, polyvinyl alcohol, polyvinyl acetate, methyl cellulose, hydroxypropyl methyl cellulose, polyvinylpyrrolidone, sulfonated polystyrenes, polyacrylamides, etc . The hydrophilic layer may be about 0.1 to about 100 μm in thickness, preferably between about 0.25 and about 50 μm thick. In a preferred embodiment, the hydrophilic layer is gelatin.

The gas-producing polymers employed in the propellant layer of the invention include self oxidizing binders, such as nitrocellulose, energetic polymers as described in U.S. Pat. No. 5,308,737, thermally decomposable polycarbonates as described in U.S. Pat. No. 5,156,938, and low ceiling temperature polymers as described in U.S. Pat. No. 5,576,144. In a preferred embodiment of the invention, the gas-producing polymer comprises a vinyl polymer having recurring units of the following formula:

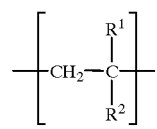

wherein:

$R^1$ and $R^2$ each independently represents a ketal group; an acetal group; a thioketal group; a thioacetal group; or an unsaturated group containing a double or triple bond between any two atoms, one of which is the atom of attachment to the polymer chain; such as cyano, carbonyl, isocyanate, azide, sulfonyl, nitro, phosphoric, phosphonyl, acetylenic, ethylenic, substituted or unsubstituted aryl or heteroaryl; or $R^1$ and $R^2$, as defined above, may be joined together to form a ring.

In a preferred embodiment of the invention, $R^1$ and $R^2$ each independently represents $-C(=X)R^3$ where X is O, S, NR, or $N^+(R)_2$; $R^3$ is R, OR, $O^-M^+$, OCOOR, SR, NHCOR, $NHCON(R)_2$, $N(R)_2$, $N^+(R)_3$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

In another preferred embodiment of the invention, the vinyl polymer has repeating units derived from alkyl cyanoacrylates or amides, or methylene diacrylates or diamides. In still another preferred embodiment, the vinyl polymer is a poly(alkyl cyanoacrylate) such as poly(methyl cyanoacrylate), poly(ethyl cyanoacrylate), poly(propyl cyanoacrylate), poly(butyl cyanoacrylate), poly(ethylhexyl cyanoacrylate), or poly(methoxyethyl cyanoacrylate).

The average molecular weights of the vinyl polymers described above may be between 1,000 and 1,000,000. Particularly good results have been obtained with polymers having a molecular weight between 2,000 and 500,000 weight average (polystyrene equivalent by size exclusion chromatography).

The vinyl polymers described above may also be copolymerized with other monomers. For example, the vinyl polymer may comprise copolymers of at least 50 wt. %, preferably more than 75 wt. %, of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Examples of vinyl polymers useful in the invention include the following:

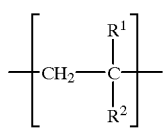

| Compound | $R^1$ | $R^2$ |
|---|---|---|
| 1 | $-C\equiv N$ | $-COOCH_3$ |
| 2 | $-C\equiv N$ | $-COOC_2H_5$ |
| 3 | $-C\equiv N$ | $-COOC_3H_7$ |

-continued

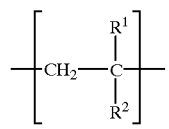

| Compound | $R^1$ | $R^2$ |
|---|---|---|
| 4 | $-C\equiv N$ | $-COOC_4H_9$ |
| 5 | $-C\equiv N$ | $-COOH$ |
| 6 | $-C\equiv N$ | $-C\equiv N$ |
| 7 | $-C\equiv N$ | $-COOCH_2CH(CH_2CH_3)C_4H_9$ |
| 8 | $-C\equiv N$ | $-COOCH_2CH_2OCH_3$ |
| 9 | $-C\equiv N$ | $-COOCH_2CH_2OCH_2CH_3$ |
| 10 | $-C\equiv N$ | $-CONHCH_3$ |
| 11 | $-C\equiv N$ | $-CON(CH_3)_2$ |
| 12 | $-COOCH_3$ | $-COOCH_3$ |
| 13 | $-CONHCH_3$ | $-CONHCH_3$ |
| 14 | $-C\equiv N$ | $(-COOCH_3)_{70}(-COOC_2H_5)_{30}$ |

As described above, the propellant layer contains a polar solvent having a polarity constant, $E_t$, value of between about 0.3 and 1.0, as described in Reichardt, C., Angew. Chem. Int. Ed. Eng., 4, 29, 1965. In a preferred embodiment of the invention, the polar solvent is pyridine, acetophenone, dichloromethane, 3-methyl-2-butanone, hexamethylphosphoric acid triamide, morpholine, tetramethylurea, 2-pentanone, 2-methyl-2-butanol, nitrobenzene, 2-butanone, 1,2-dichloroethane, cyanobenzene, 1,2-diaminoethane, 1,3-dimethyl-3,4,5,6-tetrahydro-2-pyrimidinone, acetone, N-methylpyrrolidinone, 1,3-dimethylimidazolidin-2-one, 2-methyl-2-propanol, propanenitrile, N,N-dimethylacetamide, N,N-dimethylformamide, acetic anhydride, sulfolane, aniline, dimethylsulfoxide, acetonitrile, 3-pentanol, nitromethane, 2-pentanol, propylene carbonate, cyclohexanol, 2-butanol, 2-propanol, 2-methyl-1-propanol, 3-methyl-1-butanol, 1-pentanol, 1-butanol, benzyl alcohol, 1-propanol, acetic acid, 2-aminoethanol, ethanol, 1-methoxy-2-propanol, N-methylacetamide, tetraethylene glycol, 2-methoxyethanol, 2-(2-methoxyethoxy)ethanol, triethylene glycol, diethylene glycol, N-methylformamide, methanol, ethylene glycol, formamide or mixtures thereof.

Infrared-absorbing materials which may be used in the propellant layer or in a separate contiguous layer include cyanine infrared-absorbing dyes as described in U.S. Pat. No. 4,973,572, or other materials as described in the following U.S. Pat. Nos. 4,948,777; 4,950,640; 4,950,639; 4,948,776; 4,948,778; 4,942,141; 4,952,552; 5,036,040; and 4,912,083, the disclosures of which are hereby incorporated by reference. In a preferred embodiment of the invention, the infrared-absorbing material is a cyanine dye having the formula:

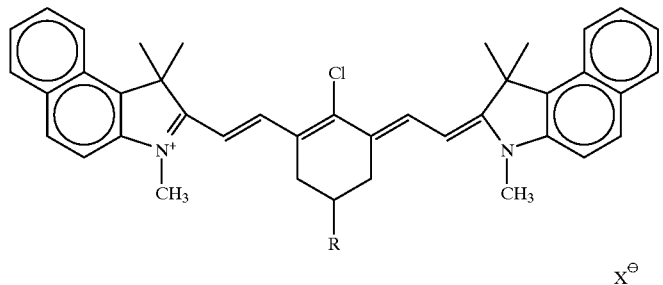

or has the following formula:

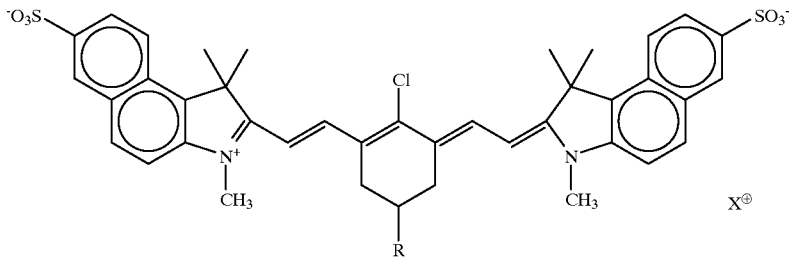

wherein:
R represents hydroxy, a substituted or unsubstituted alkyl, alkoxy or amino group having from 1 to about 10 carbon atoms, such as methyl, ethyl, propyl, butyl, t-butyl, methoxy or ethoxy; or an acyl, amide or ester group having from 1 to about 6 carbon atoms such dimethylamido, methoxycarbonyl and ethoxycarbonyl; and X represents a counterion such as halide, sulfonate, ammonium, alkyl ammonium, pyridinium, etc.

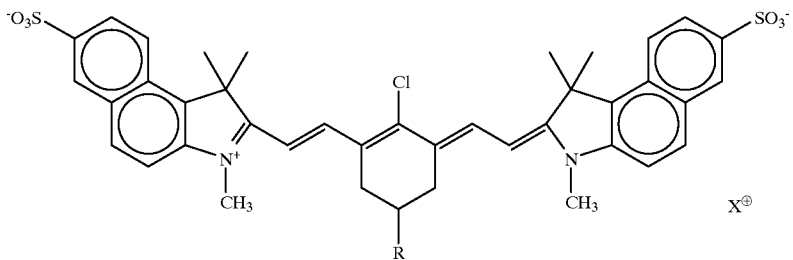

wherein

| Dye | X+ |
|---|---|
| 1 | $H^+N(C_4H_9)_3$ |
| 2 | 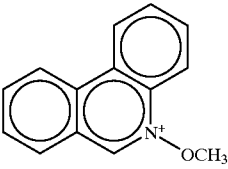 |
| 3 | 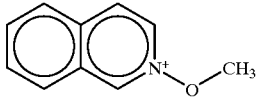 |
| 4 | 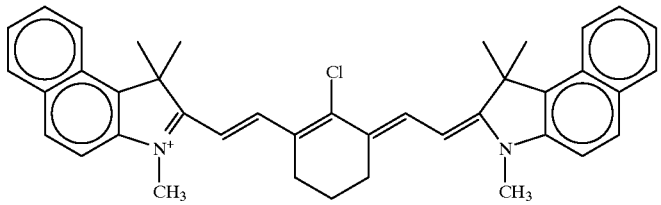 |

Dye 5

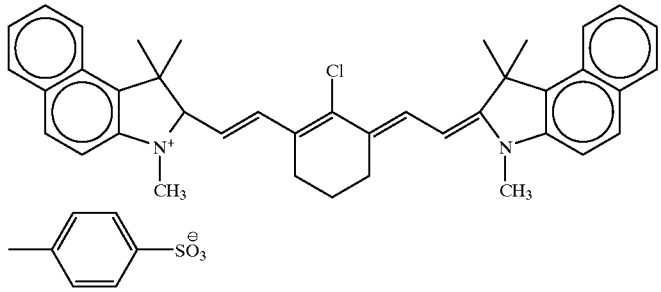

Preferably the absorbance of the layer at the emission wavelength of the exposing laser is in the range of 0.45 to 1.0. The propellant layer may also contain small amounts of addenda such as coating aids, anti-oxidants, color neutralizing dyes, UV stabilizers, etc. The propellant layer may be coated from suitable solvents onto the support by any of the techniques well known to the coating art, such as wire wound rod, applicator roll, extrusion, curtain, etc., or may be printed thereon by a printing technique such as a gravure process. Preferably the dry layer thickness is in the range of 0.1 to 1.0 $\mu$m.

As noted above, the colorant transfer layer comprises a white pigment and an optical brightener dispersed in a binder. Any white pigment may be used in the invention, such as, for example, titanium dioxide, zinc oxide, zinc sulfide, barium sulfate or calcium carbonate. The pigment may be used in an amount of from about 0.2 to about 10 $g/m^2$, preferably from about 0.4 to about 5 $g/m^2$.

The optical brightener used in the colorant transfer layer may be, for example, a stilbene, benzotriazole, benzoxazole, coumarin or pyrazoline. The optical brightener may be used in an amount of from about 0.001 to about 0.1 $g/m^2$, preferably from about 0.002 to about 0.05 $g/m^2$. The optical brightener improves the whiteness of the transferred pigment. In the absence of the optical brightener, the pigment would absorb light in the far blue region of the visible spectrum, giving it a slight cream tone.

The colorant transfer layer consists of a colorant as described above dispersed in a binder wherein at least 50%, preferably 75–90% by weight, of the binder is a monomeric or oligomeric resin and the balance is a polymeric resin. The optimal ratio of binder components depends on many factors, such as the exposure fluence and time, the rate of gas evolution within the propellant layer, the molecular weight of the polymeric component, and the Tg or Tm of the binder components.

Suitable monomer resins useful in the colorant transfer layer of the invention include hydrogenated and partially hydrogenated rosin esters and similar rosin derivatives. Commercially-available materials include the glycerol ester of partially hydrogenated wood rosin, such as Staybelite® Ester 10 (Hercules Inc.), the glycerol ester of hydrogenated rosin, such as Foral® 85 (Hercules Inc.) and the pentaerythritol ester of modified rosin, such as Pentalyn® 344 (Hercules Inc.).

Suitable oligomeric resins with a molecular weight of less than about 4,000 useful in the colorant transfer layer of the invention include polyesters, such as Tone P260® (Union Carbide Corp.), polyacrylates, polymethacrylates, alpha-methylstyrenes, polyethylene oxides, etc.

Suitable polymers useful in the colorant transfer layer of the invention preferably have a molecular weight between about 15,000 and about 50,000 and include polyacrylates, polymethacrylates, polyesters, polyvinylacetals, polyethylene-co-vinyl chloride, polycarbonates, etc. In a preferred embodiment of the invention, polyesters and polymethacrylates are employed.

The colorant transfer layer of the colorant-donor element may be coated on the support or printed thereon by a printing technique such as a gravure process. Suitable solvents are those which dissolve the binder components and dyes, if used as colorants, but do not attack the underlying propellant layer.

Preferably, the layer has a thickness from 0.3 to 4.0 $\mu$m.

The receiving element that is used with the donor elements employed in the invention usually comprises a support having thereon an image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the receiving element may also be reflective such as baryta-coated paper, polyethylene-coated paper, an ivory paper, a condenser paper or a synthetic paper such as DuPont Tyvek®. Pigmented supports such as white polyester (transparent polyester with white pigment incorporated therein) may also be used.

The image-receiving layer may comprise, for example, a polycarbonate, a polyurethane, a polyester, poly(vinyl chloride), poly(styrene-co-acrylonitrile), polycaprolactone, a poly(vinyl acetal) such as poly(vinyl alcohol-co-butyral), poly(vinyl alcohol-co-benzal), poly(vinyl alcohol-co-acetal) or mixtures thereof. The image-receiving layer may be present in any amount which is effective for the intended purpose. In general, good results have been obtained at a coverage of from about 1 to about 5 g/m$^2$.

The process of obtaining a colorant image with the colorant-donor elements employed in this invention has been generally described in U.S. Pat. No. 5,126,760 and is conveniently obtained on commercially-available laser thermal proofing systems such as the Kodak Approval® system, or the Creo Trendsetter® Spectrum system. Typically, a receiver sheet is placed on a rotating drum followed by successive placements of the individual cyan, magenta, yellow and black donor elements whereby the image for each color is transferred by image-wise exposure of the laser beam through the backside of the donor element.

As noted above, a laser is used to transfer colorant from the colorant transfer elements used in the invention. It is preferred to use a diode laser since it offers substantial advantages in terms of its small size, low cost, stability, reliability, ruggedness, and ease of modulation. In practice, before any laser can be used to heat a donor element, the element must contain an absorbing material which absorbs at the emitting wavelength of the laser.

Lasers which can be used to transfer dye or pigment from donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in U.S. Pat. No. 5,268,708, the disclosure of which is hereby incorporated by reference.

Spacer beads may be employed in a separate layer over the colorant transfer layer of the colorant donor element in the above-described laser process in order to separate the donor from the receiver element during dye transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the receiver element as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention. A multitude of different substrates can be used to prepare the color proof (the second receiver) which is preferably the same substrate as that used for the printing press run.

Examples of substrates which may be used for the second receiving element (color proof) include the following: Flo Kote Cover® (S. D. Warren Co.), Champion Textweb® (Champion Paper Co.), Quintessence Gloss® (Potlatch Inc.), Vintage Gloss® (Potlatch Inc.), Khrome Kote® (Champion Paper Co.), Consolith Gloss® (Consolidated Papers Co.), Ad-Proof Paper® (Appleton Papers, Inc.) and Mountie Matte® (Potlatch Inc.).

As noted above, after an image is obtained on a first receiving element, it may be retransferred to a second image-receiving element. This can be accomplished, for example, by passing the two receivers between a pair of heated rollers. Other methods of retransferring the image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors, i.e., red, blue and green, and then converting the light energy into electrical energy. The electrical signals are then modified by computer to form the color separation data which are used to form a halftone color proof. Instead of scanning an original object to obtain the electrical signals, the signals may also be generated by computer. This process is described more fully in *Graphic Arts Manual,* Janet Field ed., Arno Press, New York 1980 (p. 358ff), the disclosure of which is hereby incorporated by reference.

The following examples illustrate the utility of the present invention.

EXAMPLES

Example 1

Comparison 1

A propellant layer coating composition was prepared consisting of 6.16 g of a 10% solution of vinyl polymer 14 described above in cyclopentanone:N-methyl-2-pyrrolidinone (NMP) (2:1 wt. ratio), 2.05 g of a 5 wt. % of cyanine dye 5 illustrated above in NMP:methanol (2:1 wt. ratio) and 11.78 g cyclopentanone and NMP (2.5:1 wt. ratio). This composition was coated on a 100 μm polyester support which had been previously coated with a 0.43 g/m² gelatin layer.

After drying, a colorant transfer layer was then coated on top of the propellant layer consisting of a mixture consisting of 4.72 g of a 40 wt. % dispersion of $TiO_2$ in toluene, 1.05 g of resin, Staybelite® Ester 10 (Hercules Incorporated), 0.15 g of polycaprolactone, Tone® 767 (Union Carbide Corporation), and 14.08 g of toluene using a wire rod coater to provide a colorant layer with a dry laydown of 2.81 g/m² $TiO_2$ and 1.77 g/m² binder.

Element 1 of Invention

This element was the same as Control 1 except that the colorant transfer layer also contained Ciba Geigy Uvitex OB® optical brightener (2,5-bis-benzoxazole thiophene) in an amount of 0.03 g/m².

Element 2 of Invention

This element was the same as Control 1 except that the colorant transfer layer also contained Ciba Geigy Hostalux KCR® optical brightener (a benzoxazole derivative) in an amount of 0.03 g/m².

Element 3 of Invention

This element was the same as Control 1 except that the colorant transfer layer also contained Ciba Geigy Hostalux KCB® optical brightener (a benzoxazole derivative) in an amount of 0.03 g/m².

Element 4 of Invention

This element was the same as Control 1 except that the colorant transfer layer also contained bis-benzoxazole stilbene (Aldrich Chemical Company) optical brightener in an amount of 0.03 g/m².

Printing

Each of the example coatings was written on an external drum device using an 830 nm wavelength laser diode array with a centerline spacing of 10 μm between individual laser lines. The element was exposed at 500 mJ/cm². Images were written to KODAK APPROVAL® Digital Color Proofing Film I01/ Intermediate/1834 available from Kodak Polychrome Graphics. The image along with the uppermost layer of the intermediate was then laminated to a final receiver of 100 μm polyester support by means of a two roll laminator operating at 5.08 mm/sec and an average roller temperature of 120° C.

The exposed samples were analyzed with a Gretag SPM 100 reflectance densitometer (D50, 2 degree viewing angle, ANSI T) to provide the CIELab color space, a* and b*, as is discussed in detail in the Principles of Color Technology 2nd edition, F. W. Billmeyer and M. Saltzman, John Wiley and Sons, 1981, incorporated herein as reference. Since the transfer colorant is white, the ideal a* and b* would both be 0. The densitometer measurements for the 500 mJ/cm² exposure patch are given below in the following Table:

TABLE 1

| Element | a* | b* |
|---|---|---|
| Comparison | −0.78 | 2.45 |
| Invention 1 | 0.38 | 0.79 |
| Invention 2 | −0.99 | 0.50 |
| Invention 3 | −0.90 | −0.05 |
| Invention 4 | 0.19 | 0.85 |

The above results show that the elements of the invention had a* and b* values closer to 0 than the comparison element, thus indicating that the elements of the invention had an improved whiteness.

The invention has been described in detail with particular reference to preferred embodiments thereof, but it will be understood that variations and modifications can be effected within the spirit and scope of the invention.

What is claimed is:

1. A laser donor element comprising a transparent support having thereon the following layers in the order recited:

a) a hydrophilic layer;
   b) a propellant layer comprising a gas-producing polymer being capable of forming a gas upon heating by said laser and an infrared-absorbing material, said propellant layer having been coated using a polar solvent having an $E_t$ value of between about 0.3 and 1.0; and
   c) a colorant transfer layer comprising a white pigment and an optical brightener dispersed in a binder.

2. The element of claim 1, wherein said hydrophilic layer is gelatin.

3. The element of claim 1 wherein said gas-producing polymer is a vinyl polymer having recurring units of the following formula:

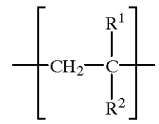

wherein:

$R^1$ and $R^2$ each independently represents a ketal group; an acetal group; a thioketal group; a thioacetal group; or an unsaturated group containing a double or triple bond between any two atoms, one of which is the atom of attachment to the polymer chain; or $R^1$ and $R^2$, as defined above, may be joined together to form a ring.

4. The element of claim 3 wherein said gas-producing polymer is a cyanoacrylate.

5. The element of claim 1 wherein said infrared-absorbing material is a cyanine dye.

6. The element of claim 5 wherein said cyanine dye is

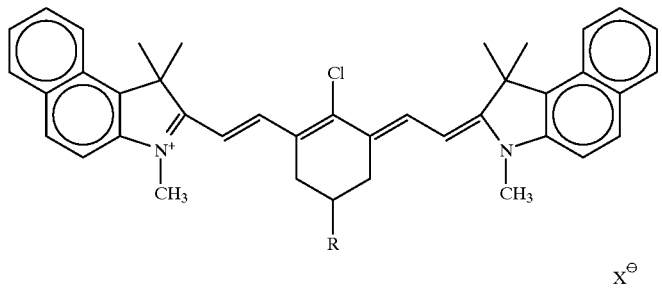

or has the following formula:

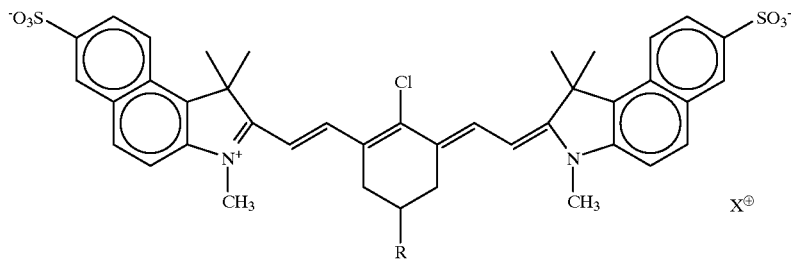

wherein:
R represents hydroxy, a substituted or unsubstituted alkyl, alkoxy or amino group having from 1 to about 10 carbon atoms or an acyl, amide or ester group having from 1 to about 6 carbon atoms; and
X represents a counterion.

7. The element of claim 1 wherein said polar solvent comprises pyridine, acetophenone, dichloromethane, 3-methyl-2-butanone, hexamethylphosphoric acid triamide, morpholine, tetramethylurea, 2-pentanone, 2-methyl-2-butanol, nitrobenzene, 2-butanone, 1,2-dichloroethane, cyanobenzene, 1,2-diaminoethane, 1,3-dimethyl-3,4,5,6-tetrahydro-2-pyrimidinone, acetone, N-methylpyrrolidinone, 1,3-dimethylimidazolidin-2-one, 2-methyl-2-propanol, propanenitrile, N,N-dimethylacetamide, N,N-dimethylformamide, acetic anhydride, sulfolane, aniline, dimethylsulfoxide, acetonitrile, 3-pentanol, nitromethane, 2-pentanol, propylene carbonate, cyclohexanol, 2-butanol, 2-propanol, 2-methyl-1-propanol, 3-methyl-1-butanol, 1-pentanol, 1-butanol, benzyl alcohol, 1-propanol, acetic acid, 2-aminoethanol, ethanol, 1-methoxy-2-propanol, N-methylacetamide, tetraethylene glycol, 2-methoxyethanol, 2-(2-methoxyethoxy)ethanol, triethylene glycol, diethylene glycol, N-methylformamide, methanol, ethylene glycol or formamide.

8. The element of claim 1 wherein said white pigment is titanium dioxide, zinc oxide, zinc sulfide, barium sulfate or calcium carbonate.

9. The element of claim 1 wherein said optical brightener is a stilbene, benzotriazole, benzoxazole, coumarin or pyrazoline.

10. A process of producing a laser-induced transfer image comprising:
I) imagewise-heating, by means of a laser, a laser donor element, and II) transferring said laser-induced image to a receiving element, said laser donor element comprising a transparent support having thereon the following layers in the order recited:
a) a hydrophilic layer;
b) a propellant layer comprising a gas-producing polymer being capable of forming a gas upon heating by a laser, an infrared-absorbing material, and a polar solvent having an $E_t$ value of between about 0.3 and 1.0; and
c) a colorant transfer layer comprising a white pigment and an optical brightener dispersed in a binder.

11. The process of claim 10 wherein said hydrophilic layer is gelatin.

12. The process of claim 10 wherein said gas-producing polymer is a vinyl polymer having recurring units of the following formula:

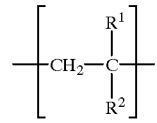

wherein:
$R^1$ and $R^2$ each independently represents a ketal group; an acetal group; a thioketal group; a thioacetal group; or an unsaturated group containing a double or triple bond between any two atoms, one of which is the atom of attachment to the polymer chain; or
$R^1$ and $R^2$, as defined above, may be joined together to form a ring.

13. The process of claim 12 wherein said gas-producing polymer is a cyanoacrylate.

14. The process of claim 10 wherein said infrared-absorbing material is a cyanine dye.

15. The process of claim 14 wherein said cyanine dye is

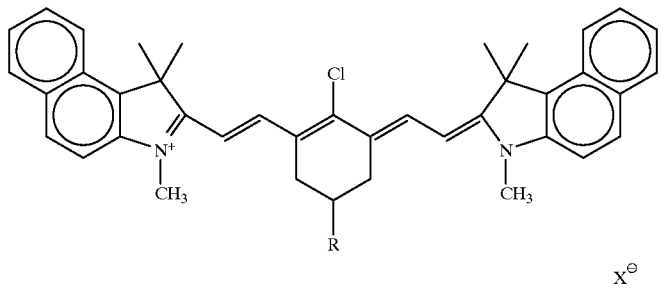

or has the following formula:

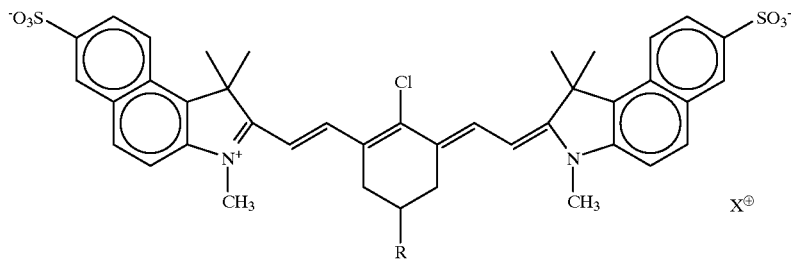

wherein:
R represents hydroxy, a substituted or unsubstituted alkyl, alkoxy or amino group having from 1 to about 10 carbon atoms or an acyl, amide or ester group having from 1 to about 6 carbon atoms; and
X represents a counterion.

16. The process of claim 10 wherein said polar solvent comprises pyridine, acetophenone, dichloromethane, 3-methyl-2-butanone, hexamethylphosphoric acid triamide, morpholine, tetramethylurea, 2-pentanone, 2-methyl-2-butanol, nitrobenzene, 2-butanone, 1,2-dichloroethane, cyanobenzene, 1,2-diaminoethane, 1,3-dimethyl-3,4,5,6-tetrahydro-2-pyrimidinone, acetone, N-methylpyrrolidinone, 1,3-dimethylimidazolidin-2-one, 2-methyl-2-propanol, propanenitrile, N,N-dimethylacetamide, N,N-dimethylformamide, acetic anhydride, sulfolane, aniline, dimethylsulfoxide, acetonitrile, 3-pentanol, nitromethane, 2-pentanol, propylene carbonate, cyclohexanol, 2-butanol, 2-propanol, 2-methyl-1-propanol, 3-methyl-1-butanol, 1-pentanol, 1-butanol, benzyl alcohol, 1-propanol, acetic acid, 2-aminoethanol, ethanol, 1-methoxy-2-propanol, N-methylacetamide, tetraethylene glycol, 2-methoxyethanol, 2-(2-methoxyethoxy)ethanol, triethylene glycol, diethylene glycol, N-methylformamide, methanol, ethylene glycol or formamide.

17. The process of claim 10 wherein said white pigment is titanium dioxide, zinc oxide, zinc sulfide, barium sulfate or calcium carbonate.

18. The process of claim 10 wherein said optical brightener is a stilbene, benzotriazole, benzoxazole, coumarin or pyrazoline.

* * * * *